(12) United States Patent
Li et al.

(10) Patent No.: US 7,554,189 B1
(45) Date of Patent: Jun. 30, 2009

(54) WIRELESS COMMUNICATION MODULE

(75) Inventors: Kuan-Hsing Li, Taichung (TW); Chia-Yang Chen, Taichung (TW)

(73) Assignee: Universal Scientific Industrial Co., Ltd., Tsao-Tun Chen, Nan-Tou Hsien (TW)

( * ) Notice: Subject to any disclaimer, the term of this patent is extended or adjusted under 35 U.S.C. 154(b) by 0 days.

(21) Appl. No.: 12/041,291

(22) Filed: Mar. 3, 2008

(51) Int. Cl.
| H01L 23/04 | (2006.01) |
| H01L 23/52 | (2006.01) |
| H01L 23/48 | (2006.01) |
| H01L 29/40 | (2006.01) |
| H01L 23/34 | (2006.01) |
| H01L 23/12 | (2006.01) |

(52) U.S. Cl. .................. 257/698; 257/773; 257/774; 257/723; 257/704

(58) Field of Classification Search .............. 257/698, 257/773, 774, 723, 704
See application file for complete search history.

(56) References Cited

U.S. PATENT DOCUMENTS

| 5,811,799 | A * | 9/1998 | Wu | 250/239 |
| 6,383,835 | B1 * | 5/2002 | Hata et al. | 438/65 |
| 6,388,264 | B1 * | 5/2002 | Pace | 250/551 |
| 6,534,726 | B1 * | 3/2003 | Okada et al. | 174/263 |
| 6,649,834 | B1 * | 11/2003 | Hsieh et al. | 174/527 |
| 6,862,190 | B2 * | 3/2005 | Olzak et al. | 361/768 |

\* cited by examiner

*Primary Examiner*—Luan C Thai
(74) *Attorney, Agent, or Firm*—Darby & Darby P.C.

(57) ABSTRACT

A wireless communication module includes: a module board including a module substrate having opposite first and second surfaces, conductive pads formed on the first surface, and an electronic component mounted to the second surface; a carrier stacked to the module board and having opposite first and second surfaces and a peripheral end that has a peripheral end face extending between the first and second surfaces of the carrier and formed with multiple spaced apart grooves; multiple spaced apart first conductive contacts formed on the first surface of the module substrate, and contacting a respective one of the module contacts; multiple spaced apart second conductive contacts formed on the second surface of the module substrate; and multiple conductive leads that interconnect the first and second conductive contacts.

6 Claims, 6 Drawing Sheets

WIRELESS COMMUNICATION MODULE

BACKGROUND OF THE INVENTION

1. Field of the Invention

The invention relates to a wireless communication module, more particularly to a wireless communication module including a module board and a carrier for connecting the module board to a motherboard.

2. Description of the Related Art

FIG. 1 illustrates a conventional wireless communication module that includes a module board 1 adapted to be mounted on a motherboard 3, and a cap-like metal cover 2 mounted on the module board 1. The module board 1 has a top surface 101, a bottom surface 102, a plurality of electronic components 103 mounted on the top surface 101, and a plurality of spaced apart conductive pads 104 formed on a peripheral end of the top surface 101.

The metal cover 2 is used to cover the electronic components 103. However, since the conductive pads 104 and the electronic components 103 are formed on the top surface 101 of the module board 1, the size of the module board 1 is required to be sufficient to avoid contact, i.e., short-circuit, between the metal cover 2 and the conductive pads 104. As such, the size of the conventional wireless communication module cannot be miniaturized.

FIGS. 2 and 3 illustrate another conventional wireless communication module that includes a module board 4 adapted to be mounted on a motherboard 3 through a frame-like carrier 5, first and second electronic components 403, 404 mounted on opposite sides of the module board 4, and a cap-like metal cover 6 mounted on the module board 4 for covering the first electronic component 403.

The module board 4 has top and bottom surfaces 401, 402. The first electronic component 403 is mounted on the top surface 401. The second electronic component 404 is mounted on the bottom surface 402 and extends into a frame space 503 in the carrier 5. A plurality of spaced apart conductive pads 405 are formed on the bottom surface 402. The carrier 5 has a top face 501 facing the bottom surface 402 of the module board 4, a bottom face 502, a plurality of spaced apart first conductive contacts 504 formed on the bottom face 502 and adapted to be connected to contacts (not shown) on the motherboard 3, and a plurality of spaced apart second conductive contacts 506 formed on the top face 501, each of which contacts a respective one of the conductive pads 405.

With the inclusion of the carrier 5 in the conventional wireless communication module, the conductive pads 405 can be formed on the bottom surface 402 instead of on the top surface 401 of the module board 4, on which the first electronic component 403 is mounted, thereby eliminating the aforesaid drawback with respect to the miniaturization of the module board. However, the connecting quality between the second conductive contacts 506 and the respective conductive pads 405 is difficult to determine by visual inspection.

SUMMARY OF THE INVENTION

Therefore, the object of the present invention is to provide a wireless communication module that can overcome the aforesaid drawbacks associated with the prior art.

Accordingly, a wireless communication module of this invention comprises: a module board including a module substrate having opposite first and second surfaces, a plurality of conductive pads formed apart on the first surface, and an electronic component mounted to the second surface; a carrier stacked to the module board and having opposite first and second surfaces and a peripheral end that has a peripheral end face extending between the first and second surfaces of the carrier, the first surfaces of the carrier and the module substrate facing each other, the carrier being formed with a plurality of spaced apart grooves indented inwardly from the peripheral end face and extending between and terminated at the first and second surfaces of the carrier, each of the grooves being defined by a groove-defining wall; a plurality of spaced apart first conductive contacts, each of which is formed on the first surface of the carrier, is terminated at the groove-defining wall of a respective one of the grooves, and contacts a respective one of the module contacts; a plurality of spaced apart second conductive contacts, each of which is formed on the second surface of the carrier and is terminated at the groove-defining wall of a respective one of the grooves; and a plurality of conductive leads, each of which is formed on the groove-defining wall of a respective one of the grooves and interconnects a respective one of the first conductive contacts and a respective one of the second conductive contacts.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
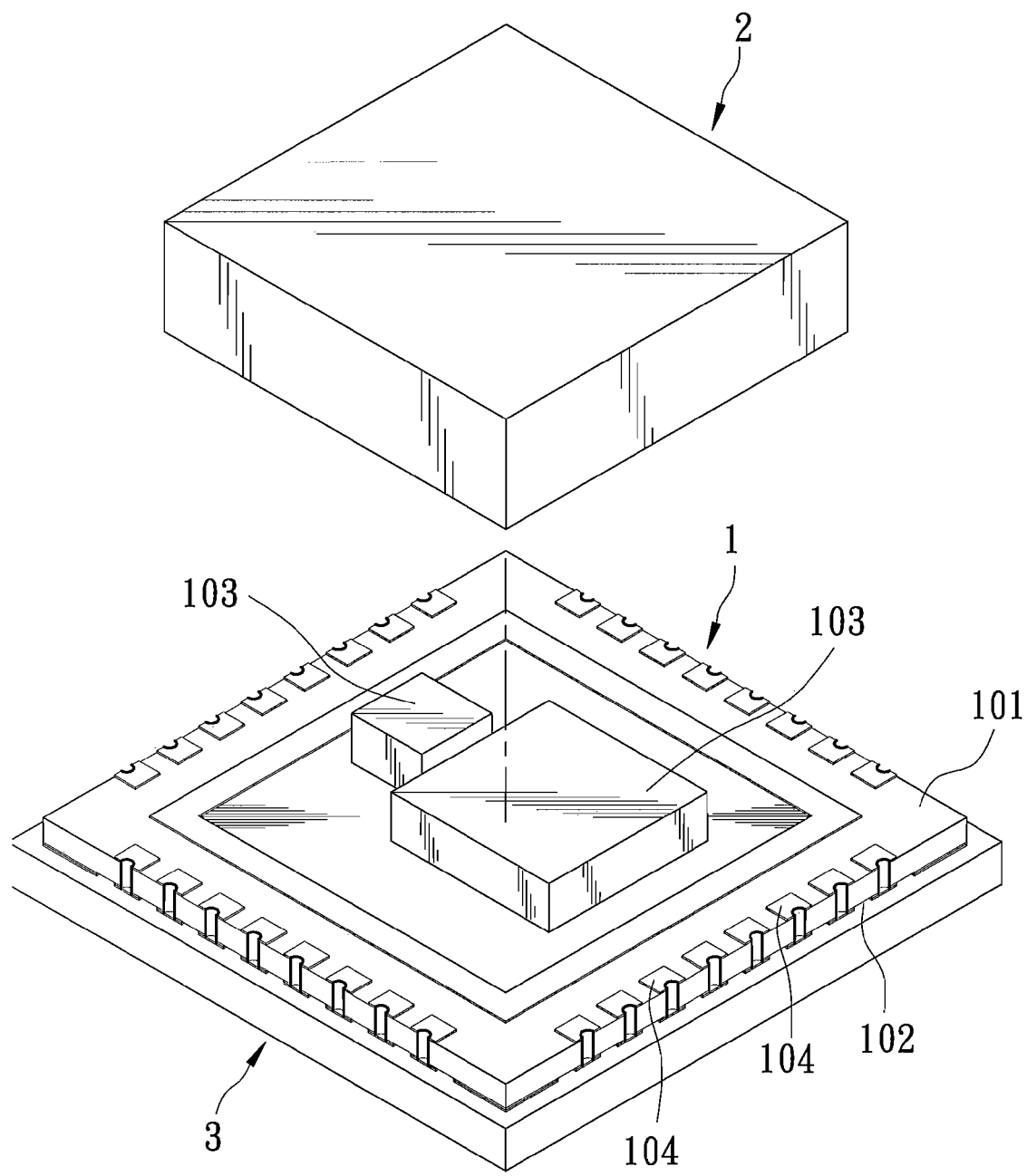
FIG. 1 is a partly exploded perspective view of a conventional wireless communication module.
Figure 2:
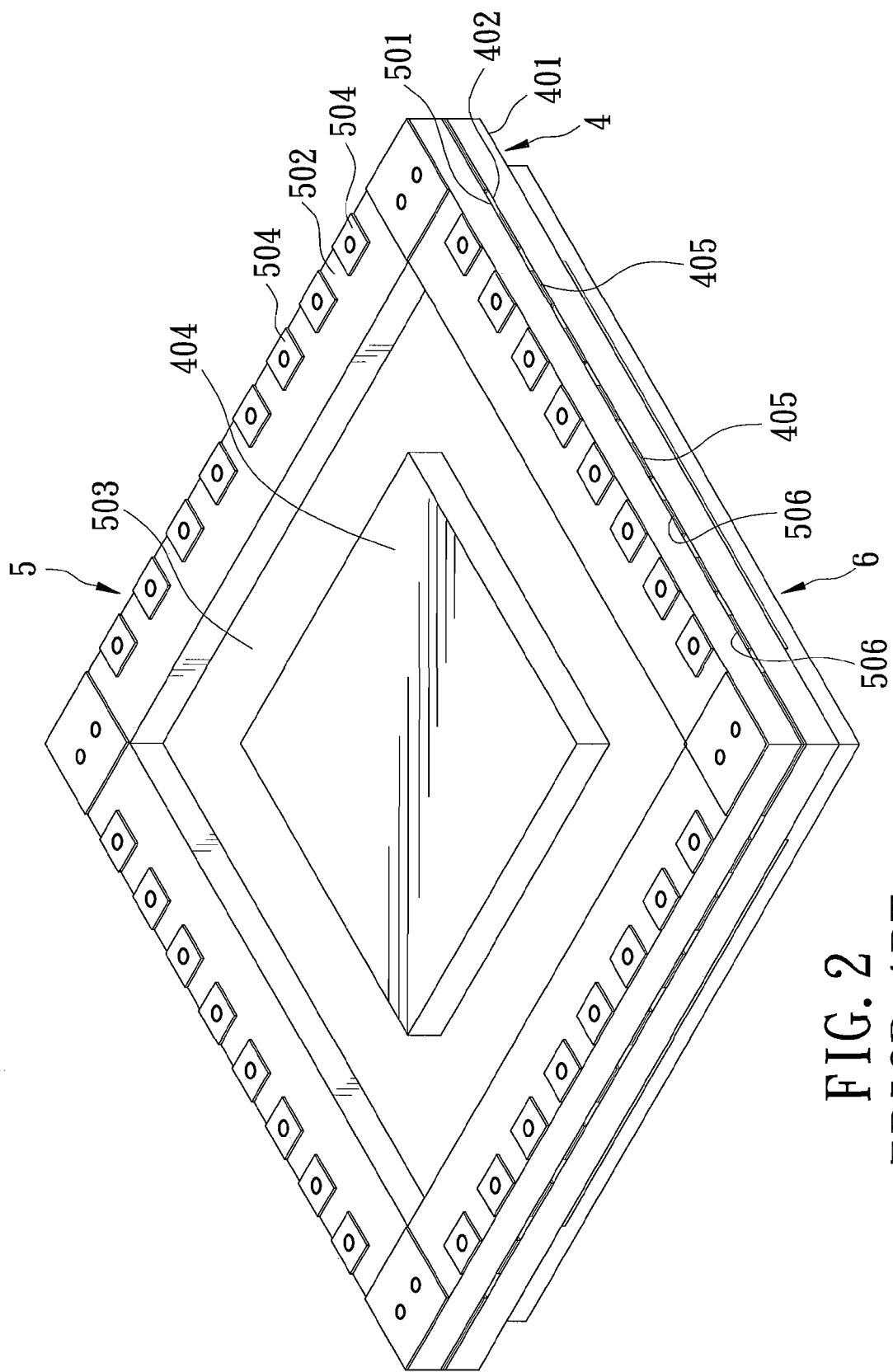
FIG. 2 is a bottom perspective view of another conventional wireless communication module.
Figure 3:
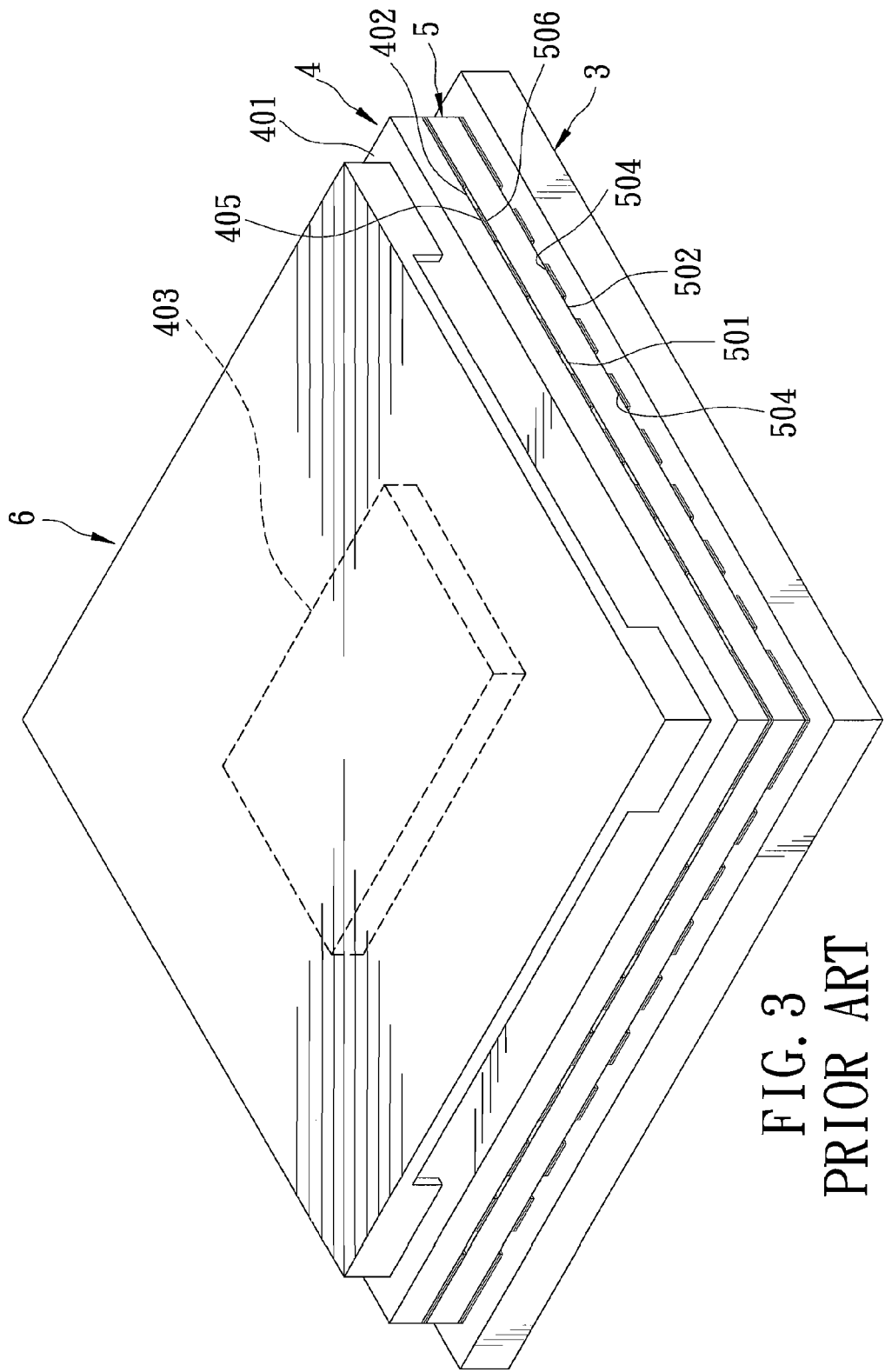
FIG. 3 is a top perspective view of the conventional wireless communication module of FIG. 2.
Figure 4:
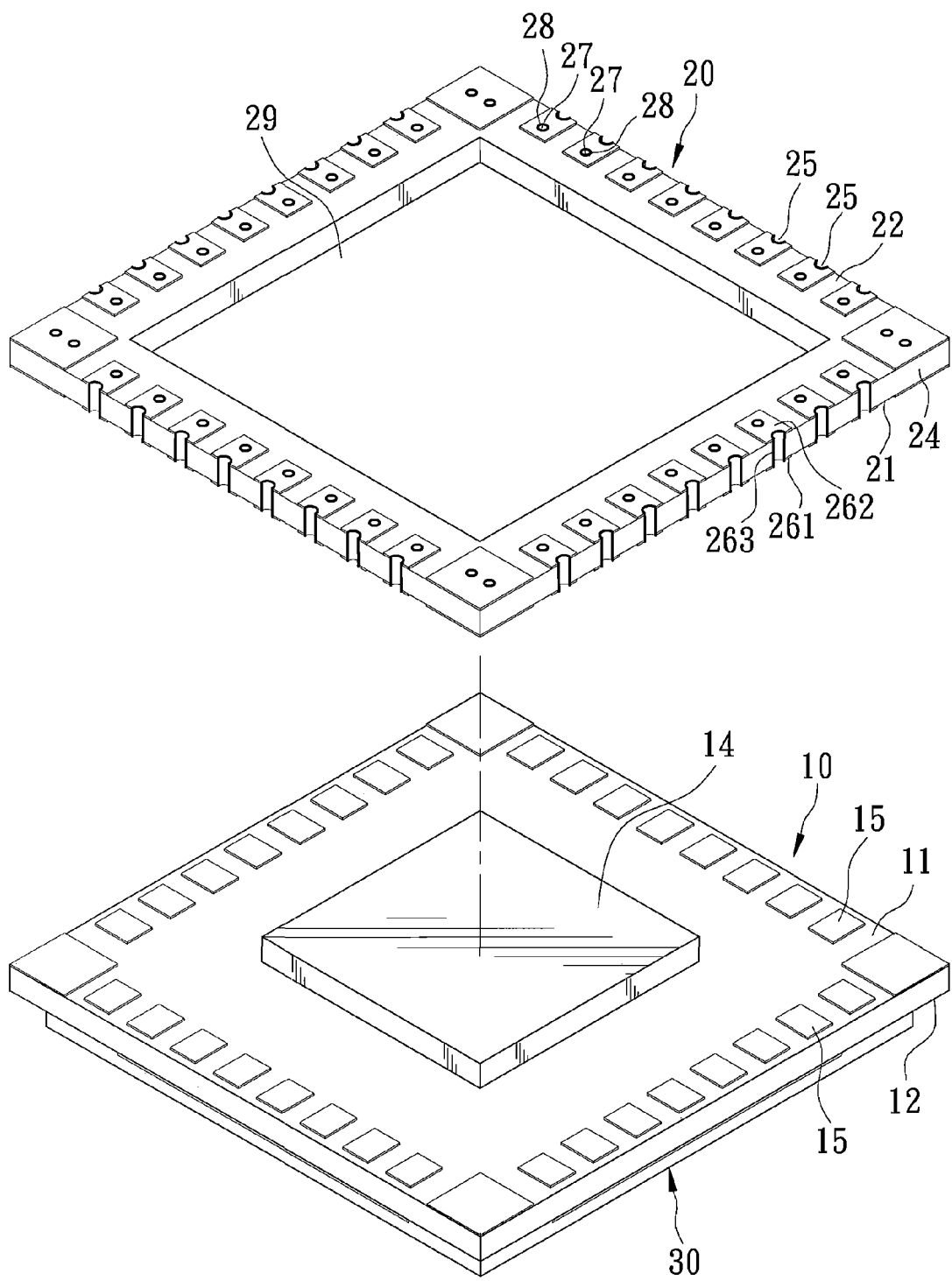
FIG. 4 is a partly exploded perspective view of the preferred embodiment of a wireless communication module according to the present invention.
Figure 5:
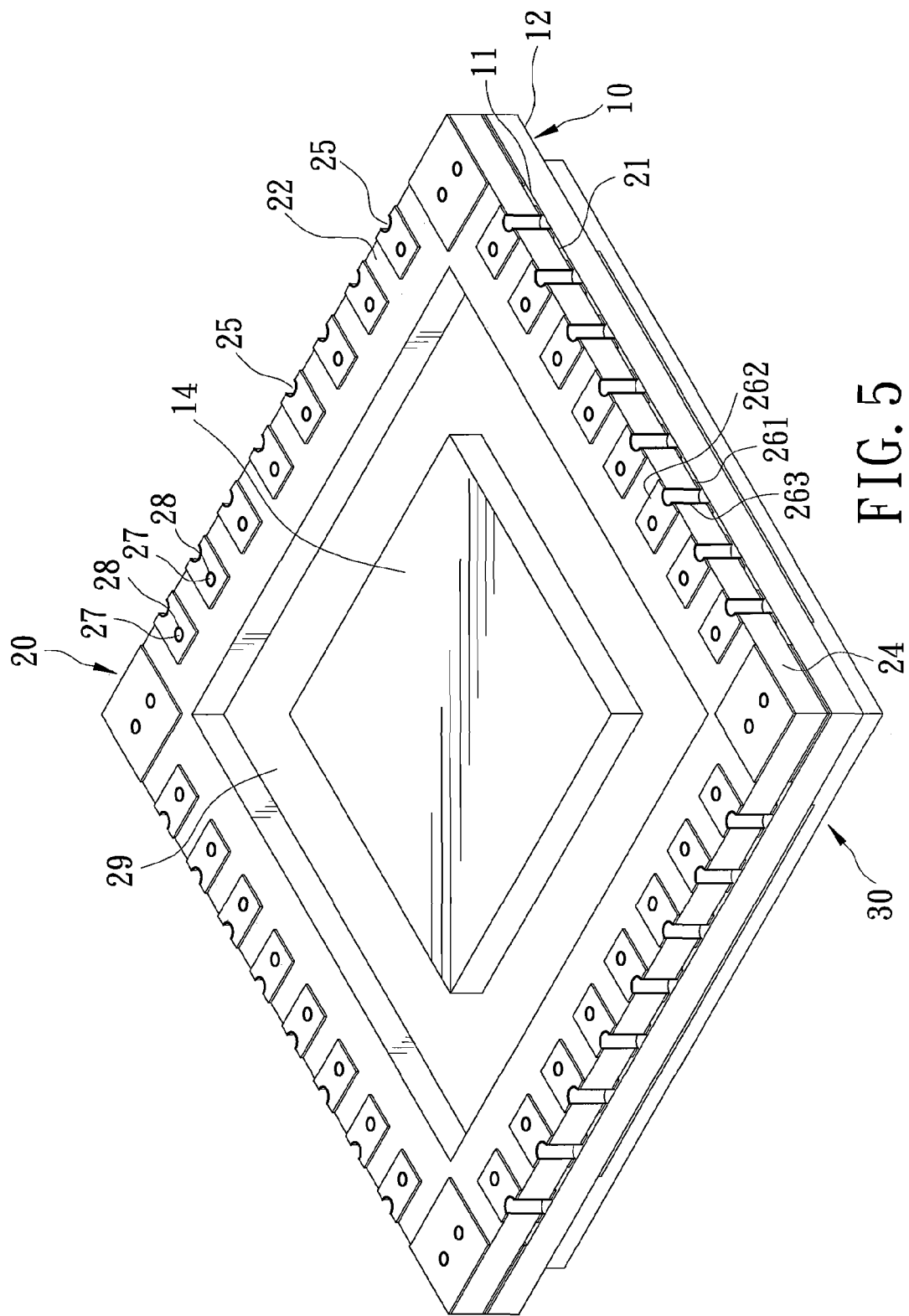
FIG. 5 is a bottom perspective view of the preferred embodiment.
Figure 6:
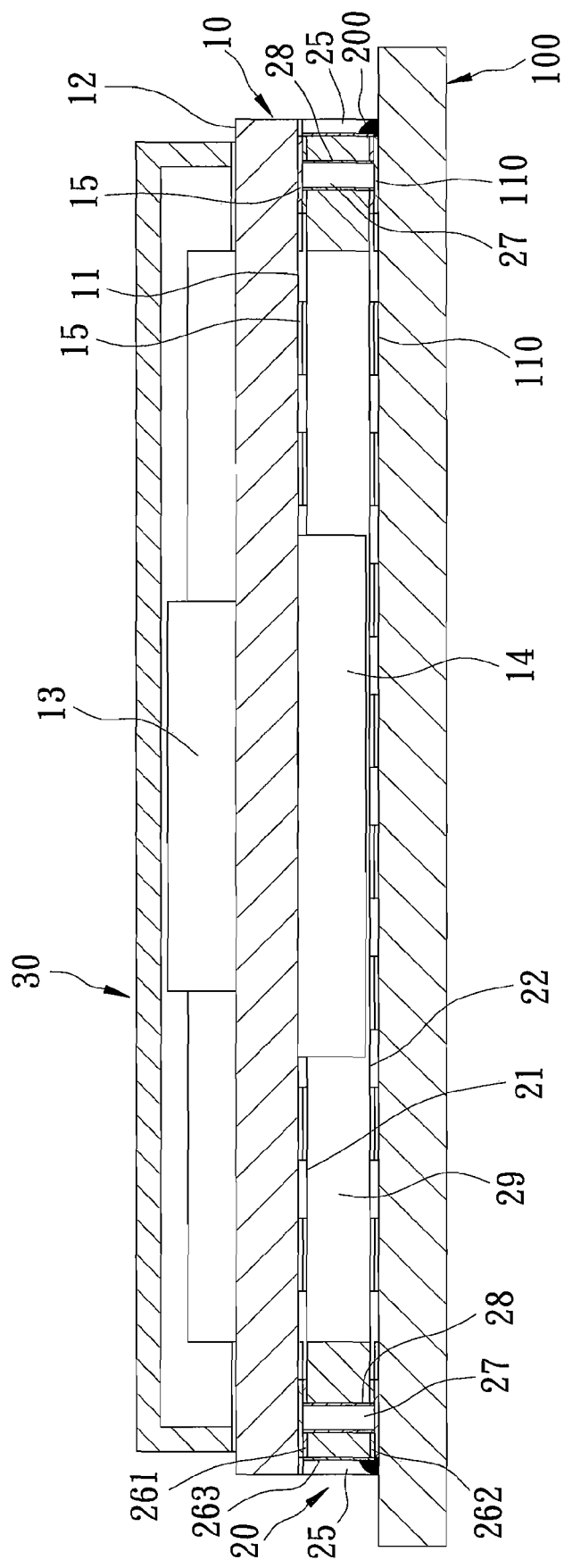
FIG. 6 is a sectional view of the preferred embodiment.

Referring to FIGS. 4 to 6, the preferred embodiment of a wireless communication module according to the present invention is shown to be adapted to be mounted to a motherboard 100 that is provided with a plurality of conductive contacts 110. The wireless communication module includes: a module board including a module substrate 10 having opposite first and second surfaces 11, 12, a plurality of conductive pads 15 formed apart on the first surface 11, and a first electronic component 13 mounted to the second surface 12; a carrier 20 stacked to the module board and having opposite first and second surfaces 21, 22 and a peripheral end that has a peripheral end face 24 extending between the first and second surfaces 21, 22 of the carrier 20, the first surface 21 of the carrier 20 and the first surface 11 of the module substrate 10 overlapping and facing each other, the carrier 20 being formed with a plurality of spaced apart grooves 25 indented inwardly from the peripheral end face 24 and extending between and terminated at the first and second surfaces 21, 22 of the carrier 20, each of the grooves 25 being defined by a groove-defining wall; a plurality of spaced apart first conductive contacts 261, each of which is formed on the first surface 21 of the carrier 20, is terminated at the groove-defining wall of a respective one of the grooves 25, and contacts a respective one of the module contacts 15; a plurality of spaced apart second conductive contacts 262, each of which is formed on the second surface 22 of the carrier 20 and is terminated at the groove-defining wall of a respective one of the grooves 25; and a plurality of conductive leads 263, each of which is formed on the groove-defining wall of a respective one of the grooves 25 and interconnects a respective one of the first conductive contacts 261 and a respective one of the second conductive contacts 262. The second conductive contacts 262 are adapted to be connected electrically and respectively to the conductive contacts 110 of the motherboard 100.

In this embodiment, the carrier 20 is in the form of a flat frame body, and is formed with a plurality of vent holes 27, each of which extends through a respective one of the first conductive contacts 261, the carrier 20, and a respective one of the second conductive contacts 262. Each of the vent holes 27 is defined by a hole-defining wall. The wireless communication module further includes a plurality of heat-dissipating bodies 28, each of which is formed on the hole-defining wall of a respective one of the vent holes 27 and interconnects a respective one of the first conductive contacts 261 and a respective one of the second conductive contacts 262.

In this embodiment, the wireless communication module further includes a second electronic component 14 mounted to the first surface 11 of the module substrate 10 and extending into a frame space 29 defined by the frame body of the carrier 20. At least one of the first and second electronic components 13, 14 has communication functionality for wireless communication.

The wireless communication module further includes a cap-like metal cover 30 mounted to the second surface 12 of the module substrate 10 to cover the first electronic component 13 and to connect electrically with the module substrate 10.

The advantages of this invention can be summarized as follows:

(1) As shown in FIG. 6, when the module board is soldered to the conductive contacts 110 of the motherboard 100 through a tin paste 200, the tin paste 200, which is applied to each pair of the second conductive contacts 262 and the conductive contacts 110, overflows into each of the grooves 25 to be coated on each of the conductive leads 263, thereby forming a solder protrusion on each of the second conductive contacts 262, which can be visually inspected.

(2) Since the second conductive contacts 262 are exposed from the entire assembly, heat generated by the motherboard 100 and the module board can be effectively dissipated through the second conductive contacts 262.

(3) Since the module board is connected electrically to the motherboard 100 through the carrier 20, and since the carrier 20 is formed with a frame space 29 for receiving the second electronic component 14, the second surface 12 of the module substrate 10 is available for mounting of the first electronic component 13. Moreover, since the conductive pads 15 are formed on the first surface 11 of the module substrate 10, the concern that the metal cover 30 may contact the module contacts as experienced in the conventional wireless communication module is eliminated, and the size of the module substrate 10 can be reduced for the purpose of miniaturization.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A wireless communication module comprising:
   a module board including a module substrate having opposite first and second surfaces, a plurality of conductive pads formed apart on said first surface, and a first electronic component mounted to said second surface;
   a carrier stacked to said module board and having opposite first and second surfaces and a peripheral end that has a peripheral end face extending between said first and second surfaces of said carrier, said first surfaces of said carrier and said module substrate facing each other, said carrier being formed with a plurality of spaced apart grooves indented inwardly from said peripheral end face and extending between and terminated at said first and second surfaces of said carrier, each of said grooves being defined by a groove-defining wall;
   a plurality of spaced apart first conductive contacts, each of which is formed on said first surface of said carrier, is terminated at said groove-defining wall of a respective one of said grooves, and contacts a respective one of said module contacts;
   a plurality of spaced apart second conductive contacts, each of which is formed on said second surface of said carrier and is terminated at said groove-defining wall of a respective one of said grooves; and
   a plurality of conductive leads, each of which is formed on said groove-defining wall of a respective one of said grooves and interconnects a respective one of said first conductive contacts and a respective one of said second conductive contacts.

2. The wireless communication module as claimed in claim 1, wherein said carrier is in the form of a flat frame body.

3. The wireless communication module as claimed in claim 2, wherein said carrier is formed with a plurality of vent holes, each of which extends through a respective one of said first conductive contacts, said carrier, and a respective one of said second conductive contacts.

4. The wireless communication module as claimed in claim 3, wherein each of said vent holes is defined by a hole-defining wall, said wireless communication module further comprising a plurality of heat-dissipating bodies, each of which is formed on said hole-defining wall of a respective one of said vent holes and interconnects a respective one of said first conductive contacts and a respective one of said second conductive contacts.

5. The wireless communication module as claimed in claim 2, further comprising a second electronic component mounted to said first surface of said module substrate and extending into a frame space defined by said frame body.

6. The wireless communication module as claimed in claim 5, further comprising a cap-like metal cover mounted to said second surface of said module substrate to cover said first electronic component.

* * * * *